United States Patent [19]
Wang

[11] Patent Number: 6,060,786
[45] Date of Patent: May 9, 2000

[54] ALIGNMENT-MARKER STRUCTURE AND METHOD OF FORMING THE SAME IN INTEGRATED CIRCUIT FABRICATION

[75] Inventor: Chien-Jung Wang, Hsinchu, Taiwan

[73] Assignee: Worldwide Semiconductor Manufacturing Corp., Hsinchu, Taiwan

[21] Appl. No.: 09/313,170

[22] Filed: May 17, 1999

[30] Foreign Application Priority Data

Apr. 26, 1999 [TW] Taiwan ................................. 88106624

[51] Int. Cl.[7] ...................................................... H01L 23/29
[52] U.S. Cl. .......................... 257/797; 257/758; 257/622
[58] Field of Search ................................... 257/797, 758, 257/621, 622, 626

[56] References Cited

U.S. PATENT DOCUMENTS

| | | |
|---|---|---|
| 4,642,672 | 2/1987 | Kitakata . |
| 5,525,840 | 6/1996 | Tominaga . |
| 5,733,801 | 3/1998 | Gojohbori . |
| 5,893,744 | 4/1999 | Wang . |
| 5,904,563 | 5/1999 | Yu . |
| 5,926,720 | 7/1999 | Zhao et al. . |

*Primary Examiner*—Sheila V. Clark
*Attorney, Agent, or Firm*—J. C. Patents; Jiawei Huang

[57] ABSTRACT

An alignment-marker structure and a method of forming the same in IC fabrication are provided. The alignment-marker structure is used for the purpose of assisting the precise alignment of a photomask used in photolithography on a wafer. In the fabrication process, a semiconductor substrate is prepared and then formed with a trench at a predefined location. A first conformal metallization layer is then formed over the substrate to a controlled thickness. Next, a sidewall-spacer structure is formed on the sidewall of the recessed portion of the first metallization layer. After this, a chemical-mechanical polishing (CMP) process is performed to polish away all the portions of the first metallization layer and the sidewall-spacer structure that lie over the top surface of the substrate. Finally, a second conformal metallization layer is formed over the substrate. Due to the conformal formation, the second metallization layer is formed with a recessed portion serving as the intended alignment mark. By the foregoing method, the resulting alignment-marker structure is more distinguishable than the prior art, allowing the mask alignment to be more precise.

8 Claims, 2 Drawing Sheets

ALIGNMENT-MARKER STRUCTURE AND METHOD OF FORMING THE SAME IN INTEGRATED CIRCUIT FABRICATION

CROSS-REFERENCE TO RELATED APPLICATION

This application claims the priority benefit of Taiwan application Ser. No. 88106624, filed Apr. 26, 1999, the full disclosure of which is incorporated herein by reference.

BACKGROUND OF THE INVENTION

1. Field of the Invention

This invention relates to integrated circuit (IC) fabrication technology, and more particularly, to an alignment-marker structure and a method of forming the same in IC fabrication, which is used for the purpose of assisting the precise alignment of a photo-mask to a wafer during a photolithographic process.

2. Description of Related Art

Photolithography is an important process in IC fabrication, which is used to transfer a predefined pattern of circuit layout from a photomask onto the wafer. As IC devices are now being fabricated at the submicron levels of integration, the photolithographic process now requires a great number of photomasks. During the photolithographic process, each photomask should be precisely aligned to the wafer; if even a slight deviation occurs in the transferred pattern, the entire wafer may be rendered unusable must then be discarded.

A conventional method for aligning a mask to a wafer is to provide a number of slots in the top surface of the wafer to serve as alignment marks on the wafer. During the photolithographic process, the mask alignment can be achieved by detecting the phase difference between the reflected light from these alignment-marker slots and the reflected light from the flat surface of the wafer to thereby obtain an alignment signal which can be used to control the precise alignment of the photomask to the wafer. The step height (i.e., the depth of these slots in the wafer surface) should be at least 200 Å (angstrom) to allow the alignment signal to be adequate enough for use in the mask alignment.

In conventional semiconductor fabrication process for forming tungsten plugs in the wafer, however, conformal tungsten is also formed within the area where the alignment-marker slots are formed. The deposited tungsten then undergoes a chemical-mechanical polishing (CMP) to polish away a surface part thereof. Next, a conformal metallization layer is formed over the entire wafer, which also covers the alignment-marker areas. Subsequently, a photolithographic and etching process is performed to form a plurality of metal lines. One drawback to the use of the CMP process, however, is that it stresses the tungsten layer and therefore roughens—the surface. Moreover, the plasma sputtering used for metal deposition also roughens the tungsten layer surface. As a consequence, the alignment-marker areas are undesirably deformed, resulting in a weak alignment signal that causes the mask alignment to be imprecise.

SUMMARY OF THE INVENTION

The invention to provide an improved alignment-marker structure and a method for forming the same, which creates a distinguishable alignment signal for more precise mask-alignment. The alignment-marker structure is formed on a semiconductor structure which comprises: (a) a substrate having a trench; (b) a first metallization layer with a recessed portion over the substrate; (c) a sidewall-spacer structure on the sidewall of the recessed portion of the first metallization layer; and (d) a second metallization layer over the substrate. The second metallization layer is formed with a recessed portion conformal to the recessed portion of the first metallization layer, and the recessed portion of the second metallization layer serves as the intended alignment mark.

The method of the invention includes the steps of: (1) preparing a semiconductor substrate; (2) forming a trench in the substrate at a predefined location; (3) forming a first conformal metallization layer with a recessed portion over the substrate to a controlled thickness that allows the bottom side of the recessed portion of the first conformal metallization layer to be lower than the top surface of the substrate; (4) forming a sidewall-spacer structure on the sidewall of the recessed portion of the first conformal metallization layer; (5) performing a chemical-mechanical polishing (CMP) process to polish away all the portions of the first conformal metallization layer and the sidewall-spacer structure that lie over the top surface of the substrate; and (6) forming a second conformal metallization layer over the substrate, with the second conformal metallization layer being formed with a recessed portion serving as the intended alignment mark.

In the invention, the CMP process is performed after the sidewall-spacer structure is formed on the first metallization layer, and therefore does not roughen the surface and reduce the step height of the alignment-marker structure as in the case of the prior art. Moreover, the resulting alignment marker structure has an adequate step height that allows the alignment mark to be easily distinguishable in the alignment of the subsequent photomask.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

FIGS. 1A–1D are schematic sectional diagrams used to depict the forming of the alignment-marker structure of the invention over a wafer.

Figure 1A:
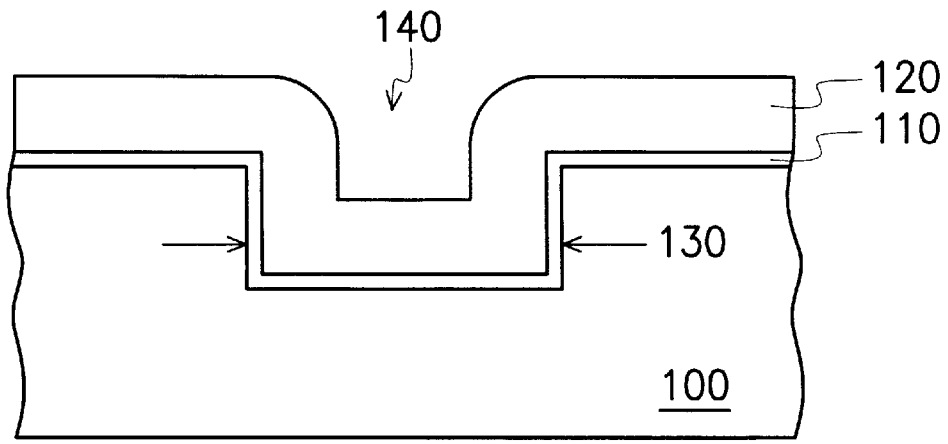
FIGS. 1A–1D are schematic sectional diagrams used to depict the forming of the alignment-marker structure of the invention over a wafer.

Referring first to FIG. 1A, in the first step of the IC fabrication, a semiconductor substrate 100 is prepared. A trench 130 is then formed at a predefined location in the substrate 100. Next, a barrier layer 110 is formed to a predefined thickness over the substrate 100 but does not fill the trench 130. The barrier layer 110 can be formed, for example, from titanium nitride through a sputtering process or a chemical-vapor deposition (CVD) process.

Figure 1B:
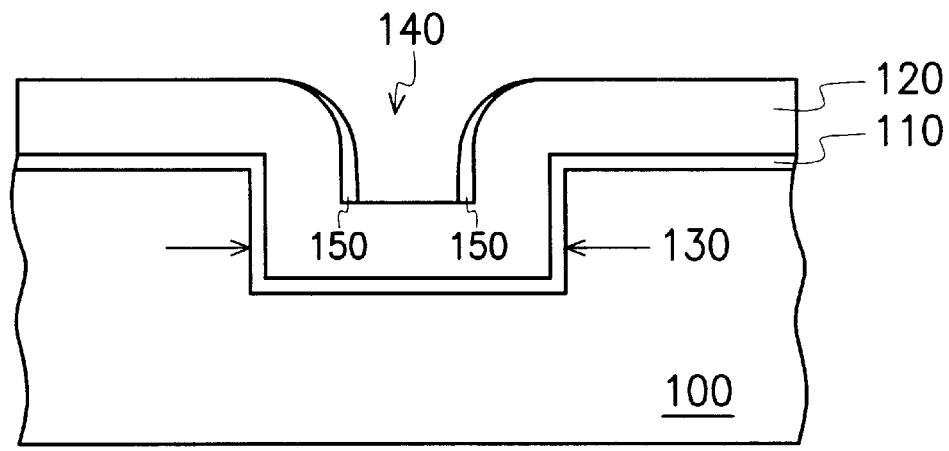

Referring next to FIG. 1B, in the subsequent step, a first conformal metallization layer 120 is formed over the barrier layer 110. The first conformal metallization layer 120 can be formed, for example, from tungsten through a CVD process. Due to the existence of the trench 130, the first conformal metallization layer 120 is formed with a recessed portion 140 right above the trench 130. The first conformal metallization layer 120 is formed to a controlled thickness that allows the bottom side of the recessed portion 140 thereof to be lower than the top surface of the substrate 100. Next, a sidewall-spacer structure 150 is formed on the sidewall of the recessed portion 140. The sidewall-spacer structure 150 can be formed, for example, through a first step of depositing silicon oxide over the first conformal metallization layer 120, and then a second step of performing an anisotropic etching process on the deposited silicon oxide until exposing the surface of the first conformal metallization layer 120 in the recessed portion 140, with the remaining portions serving as the intended sidewall-spacer structure 150.

Figure 1C:
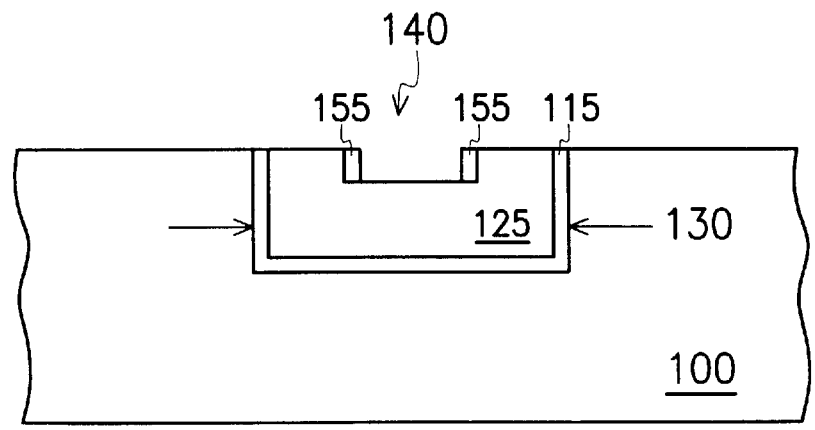

Referring further to FIG. 1C, in the subsequent step, a chemical-mechanical polishing (CMP) process is performed on the wafer until exposing the top surface of the substrate 100, whereby all the portions of the first conformal metallization layer 120, the sidewall-spacer structure 150, and the barrier layer 110 that lie directly above the top surface of the substrate 100 are polished away (the remaining part of the first conformal metallization layer 120 is herein and hereinafter designated by the reference numeral 125;, the remaining part of the sidewall-spacer structure 150 is designated by the reference numeral 155, and the remaining part of the barrier layer 110 is designated by the reference numeral 115). Since the CMP process is mainly aimed at removing the surface part of the first metallization layer 120, the sidewall-spacer structure 150 is preferably formed from a material that is less rigid than the first metallization layer 120, so that the upper part of the sidewall-spacer structure 150 can be easily removed by just the mechanical force from the CMP process.

Figure 1D:
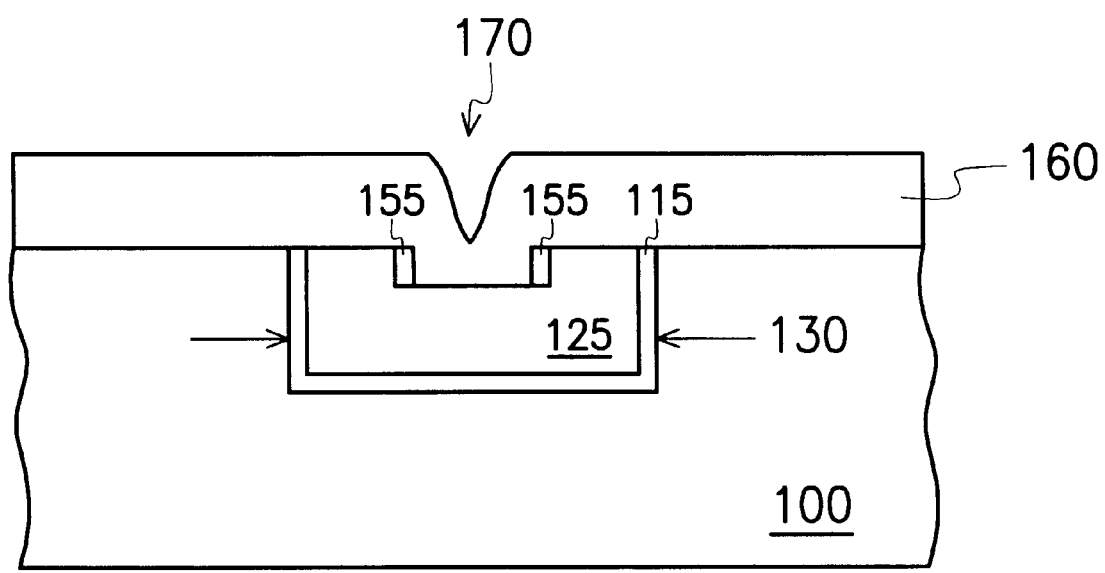

Referring next to FIG. 1D, in the subsequent step, a second conformal metallization layer 160 is formed over the entire top surface of the substrate 100. The second conformal metallization layer 160 can be formed, for example, from aluminum or copper through a sputtering process or a CVD process. Due to the existence of the recessed portion 140 in the underlying metallization layer 125, the second conformal metallization layer 160 is also formed with a recessed portion 170 directly above the recessed portion 40. This recessed portion 170 is then used to serve as an alignment mark which can be used for the alignment of the photomask used in the subsequent photolithographic process.

It is an important aspect of the invention that the CMP process is performed after forming the sidewall-spacer structure on the first metallization layer, and therefore does not roughen the surface and reduce the step height of the alignment-marker structure as in the case of the prior art. In the invention, the resulting alignment-marker structure (i.e., the recessed portion 170 of the second conformal metallization layer 160 shown in FIG. 1D) has an adequate step height that allows the alignment mark to be easily distinguishable when aligning the subsequent photomask.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A semiconductor structure with an alignment mark, which comprises:

a substrate having a trench;

a first metallization layer with a recessed portion over the substrate;

a sidewall-spacer structure on the sidewall of the recessed portion of the first metallization layer; and a second metallization layer over the substrate, wherein the second metallization layer is formed with a recessed portion conformal to the recessed portion of the first metallization layer and the recessed portion of the second metallization layer serves as the intended alignment mark.

2. The structure of claim 1, further comprising:

a barrier layer formed between the substrate and the first metallization layer.

3. The structure of claim 2, wherein the barrier layer is formed from titanium nitride.

4. The structure of claim 1, wherein the first metallization layer is formed from tungsten.

5. The structure of claim 1, wherein the sidewall-spacer structure is formed from silicon oxide.

6. The structure of claim 1, wherein the sidewall-spacer structure is formed from a material that is less rigid than the first metallization layer.

7. The structure of claim 1, wherein the second metallization layer is formed from aluminum.

8. The structure of claim 1, wherein the second metallization layer is formed from copper.

* * * * *